United States Patent
Matsukizono (10) Patent No.: US 10,937,813 B2
(45) Date of Patent: Mar. 2, 2021

(54) ACTIVE MATRIX SUBSTRATE, LIQUID CRYSTAL DISPLAY DEVICE, ORGANIC ELECTROLUMINESCENT DISPLAY DEVICE AND METHOD FOR PRODUCING ACTIVE MATRIX SUBSTRATE

(71) Applicant: Sharp Kabushiki Kaisha, Osaka (JP)

(72) Inventor: Hiroshi Matsukizono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/143,527

(22) Filed: Sep. 27, 2018

(65) Prior Publication Data

US 2019/0096919 A1     Mar. 28, 2019

(30) Foreign Application Priority Data

Sep. 28, 2017  (JP) .............................. JP2017-187574

(51) Int. Cl.

| H01L 27/12 | (2006.01) |
|---|---|
| H01L 27/32 | (2006.01) |
| H01L 29/786 | (2006.01) |
| G02F 1/1368 | (2006.01) |

(52) U.S. Cl.
CPC ........ *H01L 27/1218* (2013.01); *H01L 27/124* (2013.01); *H01L 27/1225* (2013.01); *H01L 27/1248* (2013.01); *H01L 27/1251* (2013.01); *H01L 27/1285* (2013.01); *G02F 1/1368* (2013.01); *H01L 27/3244* (2013.01); *H01L 29/7869* (2013.01); *H01L 29/78675* (2013.01)

(58) Field of Classification Search
None
See application file for complete search history.

(56) References Cited

U.S. PATENT DOCUMENTS

| 2012/0138922 A1 | 6/2012 | Yamazaki et al. |
| 2013/0320334 A1 | 12/2013 | Yamazaki et al. |
| 2014/0286076 A1 | 9/2014 | Aoki et al. |
| 2015/0221774 A1 | 8/2015 | Yamazaki et al. |
| 2015/0228803 A1 | 8/2015 | Koezuka et al. |
| 2017/0162606 A1 | 6/2017 | Yan et al. |
| 2017/0256569 A1* | 9/2017 | Ohara ............... H01L 21/02164 |

FOREIGN PATENT DOCUMENTS

| JP | 2010-003910 A | 1/2010 |
| JP | 2012-134475 A | 7/2012 |
| JP | 2014-007399 A | 1/2014 |
| JP | 2014-209727 A | 11/2014 |
| JP | 2015-181151 A | 10/2015 |
| JP | 2015-188063 A | 10/2015 |

* cited by examiner

*Primary Examiner* — Nicholas J Tobergte
*Assistant Examiner* — Kien C Ly
(74) *Attorney, Agent, or Firm* — Keating & Bennett, LLP (57) ABSTRACT

An active matrix substrate (100) according to an embodiment of the present invention has a display region (DR) defined by a plurality of pixel regions (P) arranged in a matrix pattern, and a peripheral region (FR) located around the display region. The active matrix substrate includes a substrate (1), a first TFT (10) supported on the substrate and including a crystalline silicon semiconductor layer (11), and a second TFT (20) supported on the substrate and including an oxide semiconductor layer (21). The first TFT and the second TFT each have a top gate structure. The oxide semiconductor layer is located below the crystalline silicon semiconductor layer.

10 Claims, 8 Drawing Sheets

ACTIVE MATRIX SUBSTRATE, LIQUID CRYSTAL DISPLAY DEVICE, ORGANIC ELECTROLUMINESCENT DISPLAY DEVICE AND METHOD FOR PRODUCING ACTIVE MATRIX SUBSTRATE

BACKGROUND

1. Technical Field

The present invention relates to an active matrix substrate, and particularly to an active matrix substrate that includes both oxide semiconductor TFTs and crystalline silicon TFTs. The present invention also relates to a liquid crystal display device and an organic electroluminescent display device including such an active matrix substrate, and to a method for producing such an active matrix substrate.

2. Description of the Related Art

An active matrix substrate used in a liquid crystal display device, or the like, includes a switching element such as a thin film transistor (hereinafter, "TFT") for each pixel. TFTs using an amorphous silicon film as the active layer (hereinafter, "amorphous silicon TFTs") and TFTs using a polycrystalline silicon film as the active layer (hereinafter, "polycrystalline silicon TFTs") have been widely used as such switching elements.

In recent years, it has been proposed to use an oxide semiconductor, instead of an amorphous silicon or a polycrystalline silicon, as the material of the active layer of the TFT. A TFT having an oxide semiconductor film as the active layer is referred to as an "oxide semiconductor TFT". Patent Document 1 (Japanese Laid-Open Patent Publication No. 2012-134475) discloses an active matrix substrate using an In—Ga—Zn—O-based semiconductor film as the active layer of the TFT.

An oxide semiconductor has a higher mobility than an amorphous silicon. Therefore, an oxide semiconductor TFT is capable of operating faster than an amorphous silicon TFT. Moreover, an oxide semiconductor film is formed by a simpler process than a polycrystalline silicon film, and can therefore be applied to devices that need to have large areas.

Typically, an active matrix substrate includes a display region and a peripheral region. The display region includes a plurality of pixels (pixel regions) that are arranged in a matrix pattern, and is referred to also as the active region. The peripheral region is located around the display region, and is referred to also as the frame region.

Provided in the display region are TFTs, one for each pixel, and gate bus lines, source bus lines and pixel electrodes electrically connected respectively to gate electrodes, source electrodes and drain electrodes of the TFTs.

Driver circuits for driving gate bus lines (scanning lines) and source bus lines (signal lines) are arranged in the peripheral region. Specifically, a gate driver for supplying gate signals (scanning signals) to the gate bus lines and a source driver for supplying source signals (display signals) to the source bus lines are arranged. Driver circuits such as a gate driver and a source driver may be mounted as semiconductor chips (COG (Chip On Glass) mounting), or may be formed monolithically (integrally) on an active matrix substrate. A monolithically-formed driver circuit is referred to as a "driver monolithic circuit". A driver monolithic circuit is normally composed of TFTs.

Herein, a TFT arranged as a switching element for each pixel in the display region is referred to as a "pixel TFT", and a TFT of a peripheral circuit such as a driver circuit is referred to as a "circuit TFT". With an active matrix substrate using oxide semiconductor TFTs as pixel TFTs, it is preferred to form, as circuit TFTs, oxide semiconductor TFTs using the same oxide semiconductor film as the pixel TFTs, in view of the manufacturing process.

However, while the mobility of an oxide semiconductor is higher than that of an amorphous silicon as described above, it is lower than that of a polycrystalline silicon by about one order of magnitude. Thus, an oxide semiconductor TFT has a smaller current driving capability than a polycrystalline silicon TFT. Therefore, when a driver monolithic circuit is formed using an oxide semiconductor TFT, the driving capacity may be insufficient. Increasing the size (the channel width) of the TFT in order to compensate for the lack of current driving capability will hinder the attempt to reduce the width of the peripheral region.

Patent Document 2 (Japanese Laid-open Patent Publication No. 2010-3910) discloses a configuration in which oxide semiconductor TFTs are used as pixel TFTs, and peripheral circuits include polycrystalline silicon TFTs as circuit TFTs. With the configuration disclosed in Patent Document 2, the oxide semiconductor TFT has a bottom gate structure and the polycrystalline silicon TFT has a top gate structure.

SUMMARY

However, the configuration of Patent Document 1 has the following problem.

First, with an oxide semiconductor TFT having a bottom gate structure, the gate insulating layer needs to be relatively thick in order to sufficiently cover the gate electrode, thus lowering the current driving capability. The ON current Ion of a TFT is expressed as shown in Expression (1) below.

$$\text{Ion} = (1/2) \cdot (W/L) \cdot \text{Cox} \cdot (Vg - Vth)^2 \qquad (1)$$

In Expression (1), W is the channel width, L is the channel length, Vg is the gate voltage, and Vth is the threshold voltage. Cox expressed as shown in Expression (2) below. In Expression (2), $\varepsilon_0$ is the dielectric constant of vacuum, $\varepsilon r$ is the relative dielectric constant of the gate insulating layer, and d is the thickness of the gate insulating layer.

$$\text{Cox} = \varepsilon_0 \cdot \varepsilon r / d \qquad (2)$$

As can be seen from Expressions (1) and (2), the thickness d of the gate insulating layer increases, the ON current Ion decreases.

With an oxide semiconductor TFT of a bottom gate structure, the source electrode and the drain electrode are designed to overlap with the gate electrode as seen from the substrate normal direction taking into consideration the alignment precision, etc., and the parasitic capacitance is therefore large. Therefore, when used in a large display device with a large number of pixels, the capacitive load will be large, which is disadvantageous for high-speed driving.

An optimal structure is yet to be found for an active matrix substrate that includes both oxide semiconductor TFTs and crystalline silicon TFTs as described above.

The present invention has been made in view of this problem, and an object thereof is to realize a suitable structure for an active matrix substrate that includes both oxide semiconductor TFTs and crystalline silicon TFTs.

An active matrix substrate according to an embodiment of the present invention is an active matrix substrate having a display region defined by a plurality of pixel regions arranged in a matrix pattern, and a peripheral region located around the display region, the active matrix substrate including: a substrate; a first TFT supported on the substrate and including a crystalline silicon semiconductor layer; and a second TFT supported on the substrate and including an oxide semiconductor layer, wherein: each of the first TFT and the second TFT has a top gate structure; and the oxide semiconductor layer is located below the crystalline silicon semiconductor layer.

In one embodiment, the first TFT includes: the crystalline silicon semiconductor layer; a first gate insulating layer provided on the crystalline silicon semiconductor layer; a first gate electrode provided on the first gate insulating layer and opposing the crystalline silicon semiconductor layer with the first gate insulating layer interposed therebetween; and a first source electrode and a first drain electrode electrically connected to the crystalline silicon semiconductor layer; and the second TFT includes: the oxide semiconductor layer; a second gate insulating layer provided on the oxide semiconductor layer; a second gate electrode provided on the second gate insulating layer and opposing the oxide semiconductor layer with the second gate insulating layer interposed therebetween; and a second source electrode and a second drain electrode electrically connected to the oxide semiconductor layer.

In one embodiment, the second gate insulating layer of the second TFT includes a lower gate insulating layer, and an upper gate insulating layer located on the lower gate insulating layer.

In one embodiment, the first gate insulating layer of the first TFT is formed from the same insulating film as the upper gate insulating layer of the second TFT.

In one embodiment, the crystalline silicon semiconductor layer is provided on an insulating layer that is formed from the same insulating film as the lower gate insulating layer of the second TFT.

In one embodiment, the first gate electrode of the first TFT and the second gate electrode of the second TFT are formed from the same conductive film.

In one embodiment, the first TFT is arranged in the peripheral region; and the second TFT is arranged in the display region.

In one embodiment, the first TFT is arranged in the display region; and the second TFT is arranged in the peripheral region.

In one embodiment, the oxide semiconductor layer includes an In—Ga—Zn—O-based semiconductor.

In one embodiment, the In—Ga—Zn—O-based semiconductor includes a crystalline portion.

A liquid crystal display device according to an embodiment of the present invention includes an active matrix substrate having one of the configurations set forth above.

An organic electroluminescent display device according to an embodiment of the present invention includes an active matrix substrate having one of the configurations set forth above.

A method for producing an active matrix substrate according to an embodiment of the present, invention is a method for producing an active matrix substrate including a first TFT including a crystalline silicon semiconductor layer and a second TFT including an oxide semiconductor layer, the method including the steps of: (A) forming the oxide semiconductor layer of the second TFT on a substrate; (B) forming a first insulating layer on the substrate and the oxide semiconductor layer; (C) forming the crystalline silicon semiconductor layer of the first TFT on the first insulating layer; (D) forming a second insulating layer on the crystalline silicon semiconductor layer and the first insulating layer; and (E) forming a gate electrode of the first TFT and a gate electrode of the second TFT on the second insulating layer, wherein: the step (C) includes: a step (c-1) of forming an amorphous silicon film on the first insulating layer; and a step (c-2) of performing a laser annealing process on the amorphous silicon film so as to crystallize the amorphous silicon film and modify the oxide semiconductor layer by means of heat that is generated in the laser annealing process.

In one embodiment, the method for producing an active matrix substrate of the present invention further includes a step (F) of patterning the first insulating layer and the second insulating layer, wherein: the patterning in the step (F) is performed so that a portion of the first insulating layer that overlaps with the oxide semiconductor layer and a portion of the second insulating layer that overlaps with the oxide semiconductor layer become a gate insulating layer of the second TFT, and a portion of the second insulating layer that overlaps with the crystalline silicon semiconductor layer becomes a gate insulating layer of the first TFT.

In one embodiment, in the step (E), the gate electrode of the first TFT and the gate electrode of the second TFT are formed from the same conductive film.

In one embodiment, the method for producing an active matrix substrate of the present invention further includes: a step (G) of forming an interlayer insulating film after the step (E); and a step (H) of forming a source electrode and a drain electrode of the first TFT and a source electrode and a drain electrode of the second TFT on the interlayer insulating film.

In one embodiment, the active matrix substrate has a display region defined by a plurality of pixel regions arranged in a matrix pattern, and a peripheral region located around the display region; the first TFT is arranged in the display region; and the second TFT is arranged in the peripheral region.

In one embodiment, the active matrix substrate has a display region defined by a plurality of pixel regions arranged in a matrix pattern, and a peripheral region located around the display region; the first TFT is arranged in the peripheral region; and the second TFT is arranged in the display region.

In one embodiment, the oxide semiconductor layer includes an In—Ga—Zn—O-based semiconductor.

In one embodiment, the In—Ga—Zn—O-based semiconductor includes a crystalline portion.

According to an embodiment of the present invention, it is possible to realize a suitable structure for an active matrix substrate that includes both oxide semiconductor TFTs and crystalline silicon TFTs.

DETAILED DESCRIPTION

Embodiments of the present invention will now be described with reference to the drawings. An active matrix substrate according to an embodiment of the present invention can be widely used in various display devices, electronic devices, etc. Note that the present invention is not limited to the embodiments to be described below.

Embodiment 1

Figure 1:
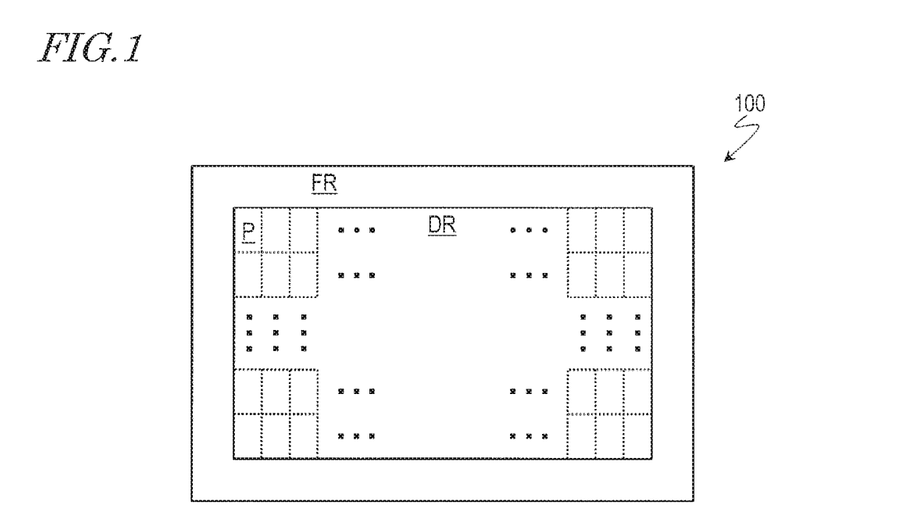
FIG. 1 is a plan view schematically showing an active matrix substrate 100 according to an embodiment of the present invention.

Referring to FIG. 1, an active matrix substrate 100 of the present embodiment will be described. FIG. 1 is a plan view schematically showing the active matrix substrate 100.

As shown in FIG. 1, the active matrix substrate 100 includes a display region DR and a peripheral region FR. The display region DR is defined by a plurality of pixel regions P. The pixel regions P are arranged in a matrix pattern including a plurality of rows and a plurality of columns. The display region DR is referred to also as the "active region". The peripheral region FR is located around the display region DR. The peripheral region FR is referred to also as the "frame region". Peripheral circuits (not shown) are provided in the peripheral region FR.

Figure 2:
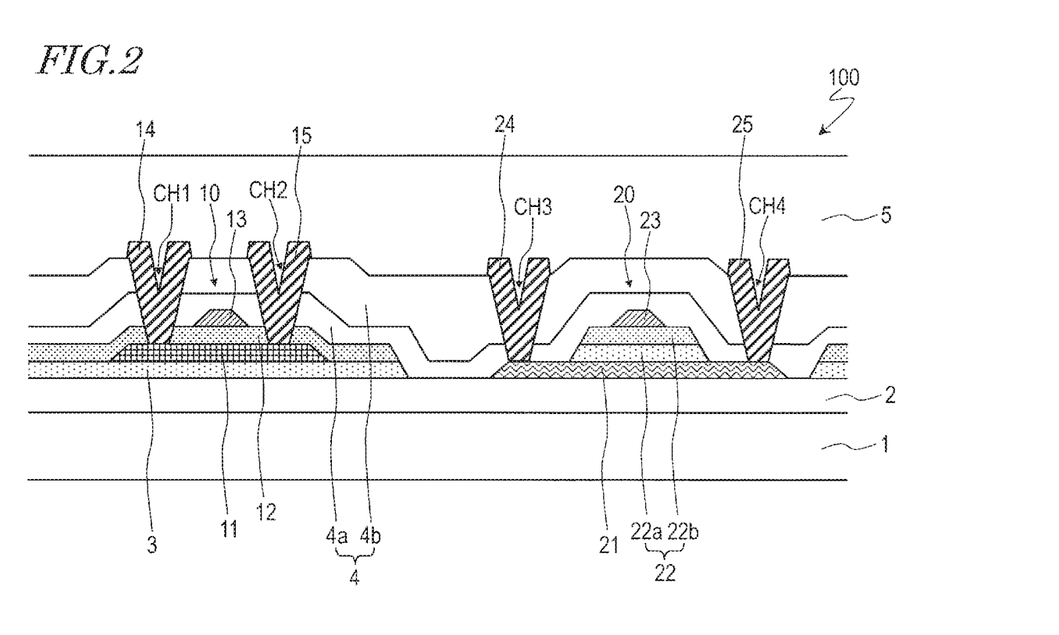
FIG. 2 is a cross-sectional view schematically showing the active matrix substrate 100.

Referring also to FIG. 2, a more specific configuration of the active matrix substrate 100 will be described. FIG. 2 is a cross-sectional view schematically showing the active matrix substrate 100.

As shown in FIG. 2, the active matrix substrate 100 includes the substrate 1, and a first TFT 10 and a second TFT 20 supported on the substrate 1.

The first TFT 10 includes a crystalline silicon semiconductor layer 11 as the active layer. That is, the first TFT 10 is a crystalline silicon TFT. In addition to the crystalline silicon semiconductor layer 11, the first TFT 10 includes a first gate insulating layer 12, a first gate electrode 13, a first source electrode 14 and a first drain electrode 15.

In the present embodiment, the crystalline silicon semiconductor layer 11 is a polycrystalline silicon layer (e.g., a low-temperature polysilicon (LTPS) layer). In the illustrated example, a base coat layer (base layer) 2 is provided on the substrate 1. The crystalline silicon semiconductor layer 11 is provided on an insulating layer 3 formed on the base coat layer 2.

The first gate insulating layer 12 is provided on the crystalline silicon semiconductor layer 11. The first gate electrode 13 is provided on the first gate insulating layer 12. The first gate electrode 13 opposes the crystalline silicon semiconductor layer 11 with the first gate insulating layer 12 interposed therebetween.

The first source electrode 14 and the first drain electrode 15 are electrically connected to the crystalline silicon semiconductor layer 11. In the present embodiment, an interlayer insulating layer 4 is provided so as to cover the first gate electrode 13, the first gate insulating layer 12, etc. In the example shown in FIG. 2, the interlayer insulating layer 4 includes a lower interlayer insulating layer 4a, and an upper interlayer insulating layer 4b located on the lower interlayer insulating layer 4a. That is, the interlayer insulating layer 4 has a layered structure. The first source electrode 14 and the first drain electrode 15 are provided on the interlayer insulating layer 4. The first source electrode 14 and the first drain electrode 15 are connected to the crystalline silicon semiconductor layer 11 respectively through a first contact hole CH1 and a second contact hole CH2 running through the interlayer insulating layer 4 and the first gate insulating layer 12.

The second TFT 20 includes an oxide semiconductor layer 21 as the active layer. That is, the second TFT 20 is an oxide semiconductor TFT. In addition to the oxide semiconductor layer 21, the second TFT 20 includes a second gate insulating layer 22, a second gate electrode 23, a second source electrode 24 and a second drain electrode 25.

The oxide semiconductor layer 21 includes an In—Ga—Zn—O-based semiconductor, for example. The oxide semiconductor layer 21 is provided on the base coat layer 2.

The second gate insulating layer 22 is provided on the oxide semiconductor layer 21. The second gate insulating layer 22 includes a lower gate insulating layer 22a, and an upper gate insulating layer 22b located on the lower gate insulating layer 22a. That is, the second gate insulating layer 22 has a layered structure. The lower gate insulating layer 22a is formed from the same insulating film as the insulating layer 3 located under the crystalline silicon semiconductor layer 11. The upper gate insulating layer 22b is formed from the same insulating film as the first gate insulating layer 12 of the first TFT 10.

The second gate electrode 23 is provided on the second gate insulating layer 22. The second gate electrode 23 opposes the oxide semiconductor layer 21 with the second gate insulating layer 22 interposed therebetween. The second gate electrode 23 is formed from the same conductive film as the first gate electrode 13 of the first TFT 10.

The second source electrode 24 and the second drain electrode 25 are electrically connected to the oxide semiconductor layer 21. The interlayer insulating layer 4 covers the second gate electrode 23, the second gate insulating layer 22 and the oxide semiconductor layer 21, and the second source electrode 24 and the second drain electrode 25 are provided on the interlayer insulating layer 4. The second source electrode 24 and the second drain electrode 25 are connected to the oxide semiconductor layer 21 respectively through a third contact hole CH3 and a fourth contact hole CH4 running through the interlayer insulating layer 4. As seen from the substrate plane normal direction, the second source electrode 24 and the second drain electrode 25 do not overlap with the second gate electrode 23.

An organic insulating layer (flattening layer) 5 is provided on the interlayer insulating layer 4 so as to cover the first TFT 10 and the second TFT 20.

As described above, with the active matrix substrate 100 of the present embodiment, the first TFT 10 and the second TFT 20 each have a top gate structure. That is, not only the first TFT 10, which is a crystalline silicon TFT, but also the second TFT 20, which is an oxide semiconductor TFT, has a top gate structure.

When the second TFT 20 has a top gate structure, as opposed to a bottom gate structure, the second gate insulating layer 22 does not need to cover the second gate electrode 23 (i.e., a relatively thick wiring layer), it is possible to reduce the thickness of the second gate insulating layer 22. Therefore, it is possible to increase the current driving capability of the second TFT 20.

Since the second gate electrode 23 does not need to overlap with the second source electrode 24 and the second drain electrode 25, it is possible to reduce the parasitic capacitance. Therefore, even when the active matrix substrate 100 is used in a large display device with a large number of pixels, it is possible to reduce the capacitive load and it is possible to desirably realize high-speed driving.

With the active matrix substrate 100 of the present embodiment, the oxide semiconductor layer 21 is located below the crystalline silicon semiconductor layer 11 (in other words, the distance from the substrate 1 to the oxide semiconductor layer 21 is smaller than the distance from the substrate 1 to the crystalline silicon semiconductor layer 11).

With the oxide semiconductor layer 21 located below the crystalline silicon semiconductor layer 11, it is possible to modify the oxide semiconductor layer 21 by making use of the laser annealing process that is performed for forming the crystalline silicon semiconductor layer 11. More specifically, using the heat that is generated in the laser annealing process for crystallizing an amorphous silicon semiconductor film, it is possible to reduce the defect levels of the oxide semiconductor layer 21 to improve the mobility thereof. Moreover, it is also possible to reduce the defect levels of the lower gate insulating layer 22a to improve the reliability.

With the active matrix substrate 100 of the present embodiment, it is possible to form the first gate electrode 13 of the first TFT 10 and the second gate electrode 23 of the second TFT 20 from the same conductive film, thus simplifying the producing process.

Moreover, with the configuration illustrated in FIG. 2, the second gate insulating layer 22 of the second TFT 20 includes the lower gate insulating layer 22a in addition to the upper gate insulating layer 22b formed from the same insulating film as the first gate insulating layer 12 of the first TFT 10. Thus, the thickness of the second gate insulating layer 22 of the second TFT 20 is greater than the thickness of the first gate insulating layer 12 of the first TFT 10. Therefore, it is possible to increase the withstand voltage of the second TFT 20, thereby allowing the second TFT 20 to be driven with a higher voltage than the first TFT 10.

Next, an example of a method for producing the active matrix substrate 100 will be described. FIG. 3A to FIG. 6D are cross-sectional views each illustrating a step of a method for producing the active matrix substrate 100.

Figure 3A:
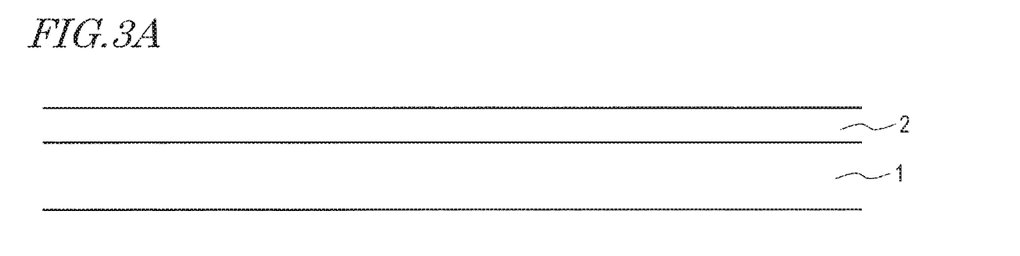
FIGS. 3A to 3D are cross-sectional views each illustrating a step of a method for producing the active matrix substrate 100.

First, as shown in FIG. 3A, the base coat layer 2 is formed on the substrate 1. The substrate 1 is an insulative transparent substrate (e.g., a glass substrate). The base coat layer 2 has a layered structure including a silicon nitride (SiNx) layer as the lower layer and a silicon oxide ($SiO_2$) layer as the upper layer, for example, but it is understood that the structure is not limited to this.

Figure 3B:
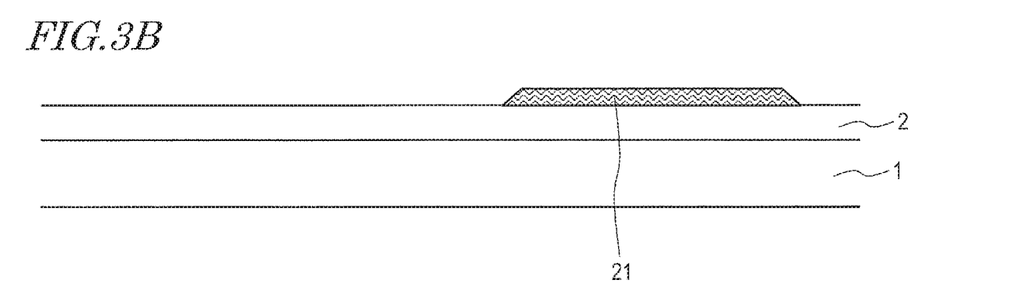

Next, as shown in FIG. 3B, the oxide semiconductor layer 21 is formed on the substrate 1 (herein, on the base coat layer 2). Specifically, by depositing an oxide semiconductor film on the base coat layer 2 and then patterning the oxide semiconductor film, it is possible to form the oxide semiconductor layer 21 having an island-like shape. The oxide semiconductor layer 21 is formed from an In—Ga—Zn—O-based semiconductor whose ratio (composition ratio) between In, Ga and Zn is 1:1:1, for example. The thickness of the oxide semiconductor layer 21 is 10 nm or more and 150 nm or less, for example.

Figure 3C:
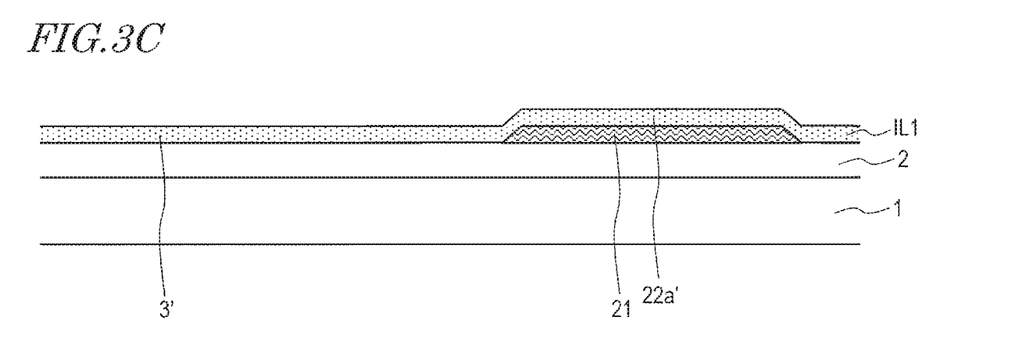

Next, as shown in FIG. 3C, an insulating layer (hereinafter referred to as the "first insulating layer") IL1 is formed on the substrate 1 (herein, on the base coat layer 2) and on the oxide semiconductor layer 21. The first insulating layer IL1 includes a portion 22a' to be the lower gate insulating layer 22a of the second TFT 20, and a portion 3' to be the insulating layer 3 that is located under the crystalline silicon semiconductor layer 11 of the first TFT 10. The first insulating layer IL1 is a silicon oxide ($SiO_2$) layer having a thickness of 30 nm or more and 70 nm or less, for example.

Figure 3D:
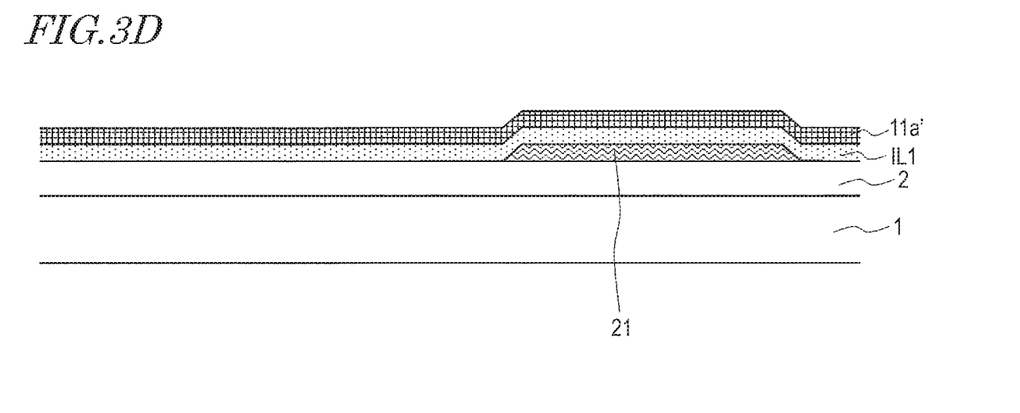

Next, the crystalline silicon semiconductor layer 11 is formed on the first insulating layer IL1. Specifically, first, as shown in FIG. 3D, an amorphous silicon (a-Si) film 11a' is formed on the first insulating layer IL1.

Figure 4A:
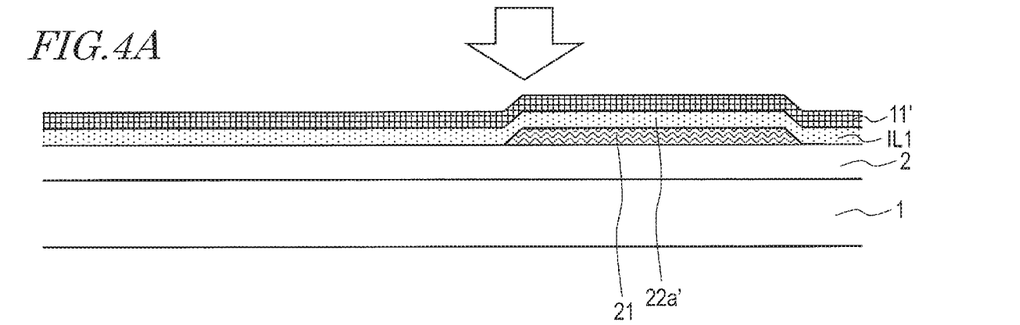
FIGS. 4A to 4D are cross-sectional views each illustrating a step of a method for producing the active matrix substrate 100.

Next, as shown in FIG. 4A, a laser annealing process is performed by irradiating the amorphous silicon film 11a' with excimer laser light. Thus, the amorphous silicon film 11a' is crystallized to be a crystalline silicon film 11'. At this point, the oxide semiconductor layer 21 is modified by the heat that is generated in the laser annealing process. The light energy of the laser annealing process is absorbed by the amorphous silicon film 11a' and converted to heat, thereby melting and crystallizing the amorphous silicon. The heat in this process is transmitted also to the oxide semiconductor layer 21 via the first insulating layer IL1 (the portion 22a' to be the lower gate insulating layer 22a) (thermal annealing effect), thereby reducing the defect levels of the oxide semiconductor layer 21 and improving the mobility thereof. This also reduces the defect levels of the portion 22a' to be the lower gate insulating layer 22a, improving the reliability. Moreover, since the laser annealing process is performed with the first insulating layer IL1 and the amorphous silicon film 11a' layered on the oxide semiconductor layer 21, the composition does not change due to a metal component whose vapor pressure is low and oxygen being discharged to the outside from the oxide semiconductor layer 21, thus realizing a desirable annealing effect. There is no particular restriction on the conditions of the laser annealing process, and it is possible to use any of various conditions known in the art for crystallizing an amorphous silicon film to obtain a crystalline silicon film.

Typically, a dehydrogenation annealing process for reducing hydrogen in the amorphous silicon film 11a' (e.g., an annealing process for 1 to 2 hours at 400° C. to 450° C.) is performed after the formation of the amorphous silicon film 11a' and before the laser annealing process. Also during this dehydrogenation annealing process, the oxide semiconductor layer 21 can be modified.

Figure 4B:
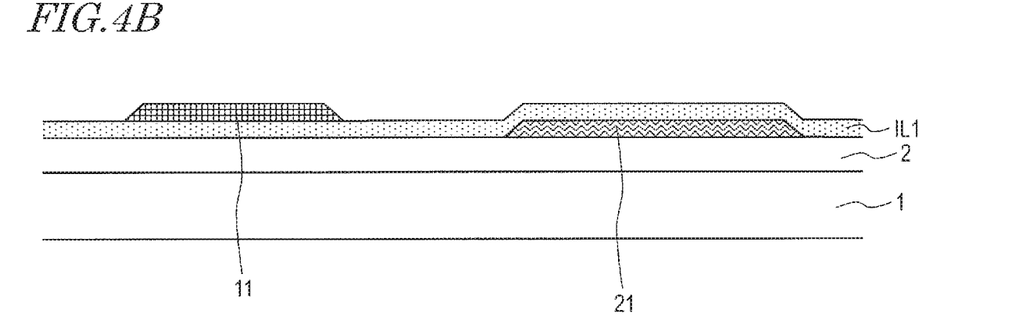

Next, as shown in FIG. 4B, the crystalline silicon film 11' is patterned, thereby forming the crystalline silicon semiconductor layer 11 having an island-like shape. The thickness of the crystalline silicon semiconductor layer 11 is 30 nm or more and 100 nm or less, for example.

Figure 4C:
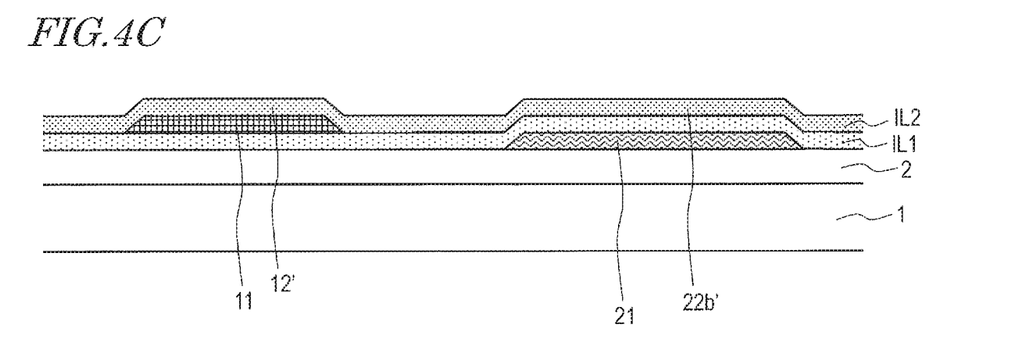

Next, as shown in FIG. 4C, an insulating layer (hereinafter referred to as a "second insulating layer") IL2 is formed on the crystalline silicon semiconductor layer 11 and the first insulating layer IL1. The second insulating layer IL2 includes a portion 12' to be the first gate insulating layer 12 of the first TFT 10, and a portion 22b' to be the upper gate insulating layer 22b of the second TFT 20. The second insulating layer IL2 is a silicon oxide ($SiO_2$) layer having a thickness of 70 nm or more and 120 nm or less, for example.

Figure 4D:
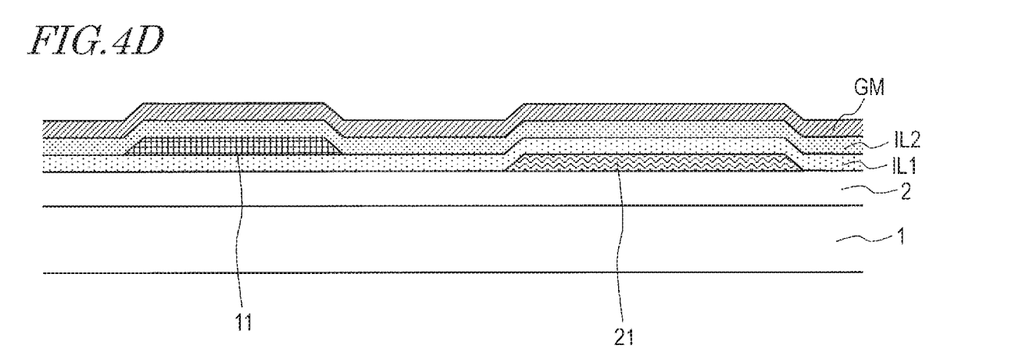

Next, the first gate electrode 13 and the second gate electrode 23 are formed on the second insulating layer IL2. Specifically, first, as shown in FIG. 4D, a gate conductive film (gate metal film) GM is formed on the second insulating layer IL2. The material of the gate conductive film GM may be a metal such as molybdenum (Mo), tungsten (W), aluminum (Al), copper (Cu), titanium (Ti), tantalum (Ta), etc., or an alloy thereof, for example. The gate conductive film GM may have a layered structure including a plurality of layers formed from different conducive materials. The thickness of the gate conductive film GM is 50 nm or more and 500 nm or less, for example.

Figure 5A:
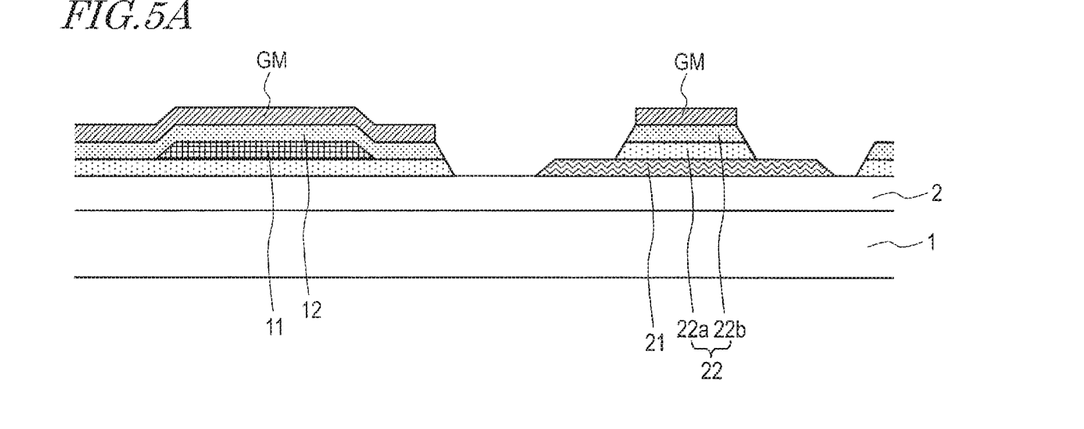
FIGS. 5A to 5C are cross-sectional views each illustrating a step of a method for producing the active matrix substrate 100.
Figure 5B:
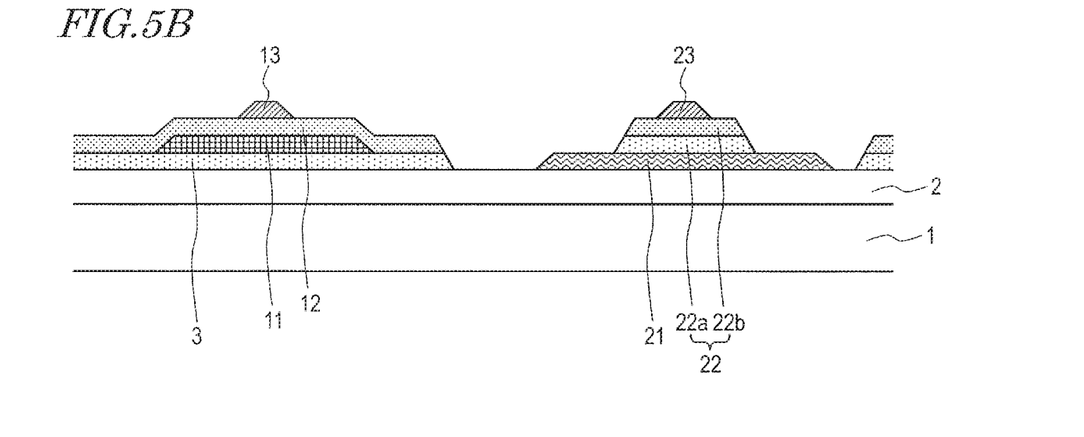

Next, as shown in FIGS. 5A and 5B, the gate conductive film GM is patterned by etching so as to form the first gate electrode 13 and the second gate electrode 23. In this process, as shown in FIG. 5A, the first insulating layer IL1 and the second insulating layer IL2 are also patterned by etching so that a portion of the first insulating layer IL1 that overlaps with the oxide semiconductor layer 21 and a portion of the second insulating layer IL2 that overlaps with the oxide semiconductor layer become the second gate insulating layer 22, and a portion of the second insulating layer IL2 that overlaps with the crystalline silicon semiconductor layer 11 becomes the first gate insulating layer 12.

Next, the crystalline silicon semiconductor layer 11 is doped with an impurity using the first gate electrode 13 as a mask, thereby forming the source region and the drain region. A region of the crystalline silicon semiconductor layer 11 that is not doped with an impurity becomes the channel region (active region).

Figure 5C:
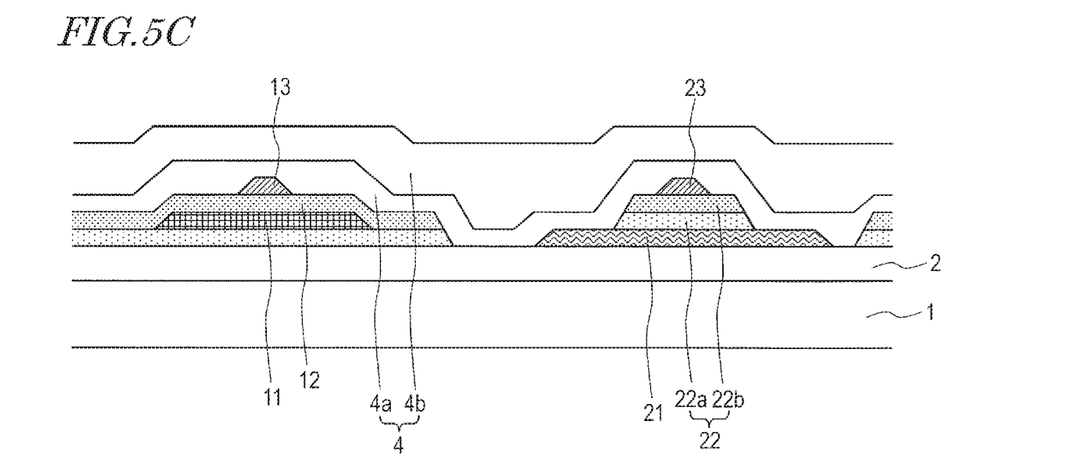

Next, as shown in FIG. 5C, the interlayer insulating layer 4 is formed so as to cover the first gate electrode 13, the second gate electrode 23, the first gate insulating layer 12, the second gate insulating layer 22 and the oxide semiconductor layer 21. The lower interlayer insulating layer 4a is a silicon nitride (SiNx) layer, for example, and the upper interlayer insulating layer 4b is a silicon oxide (SiO₂) layer, for example.

Figure 6A:
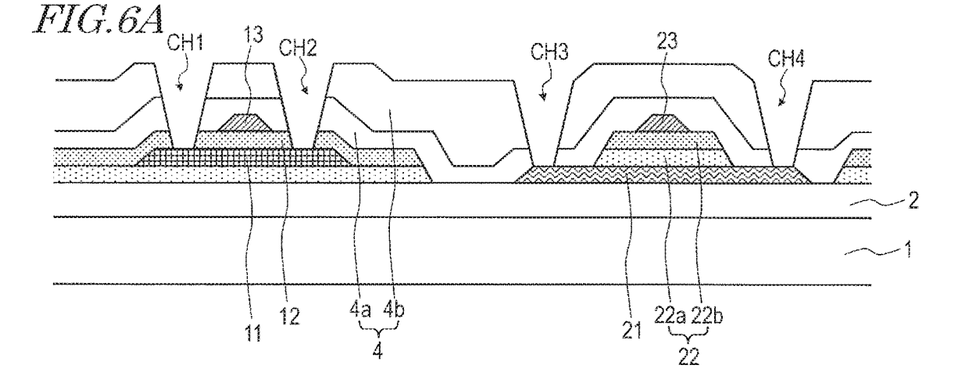
FIGS. 6A to 6C are cross-sectional views each illustrating a step of a method for producing the active matrix substrate 100.

Next, as shown in FIG. 6A, the first contact hole CH1, the second contact hole CH2, the third contact hole CH3 and the fourth contact hole CH4 are formed by etching in the interlayer insulating layer 4 and the first gate insulating layer 12. Portions of the crystalline silicon semiconductor layer 11 are exposed through the first contact hole CH1 and the second contact hole CH2, and portions of the oxide semiconductor layer 21 are exposed through the third contact hole CH3 and the fourth contact hole CH4.

Figure 6B:
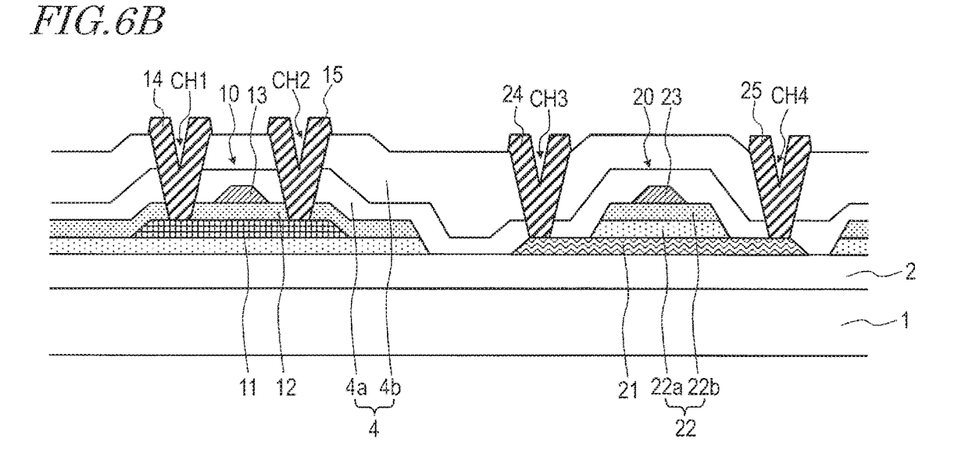

Next, as shown in FIG. 6B, the first source electrode 14, the first drain electrode 15, the second source electrode 24 and the second drain electrode 25 are formed on the interlayer insulating layer 4. Specifically, a source-drain conductive film (source metal film) is formed on the interlayer insulating layer 4 and then the source-drain conductive film is patterned, thereby forming the first source electrode 14, the first drain electrode 15, the second source electrode 24 and the second drain electrode 25. The material of the source-drain conductive film may be a metal such as molybdenum (Mo), tungsten (W), aluminum (Al), copper (Cu), titanium (Ti), tantalum (Ta), etc., or an alloy thereof, for example. The thickness of the source-drain conductive film is 100 nm or more and 500 nm or less, for example.

Figure 6C:
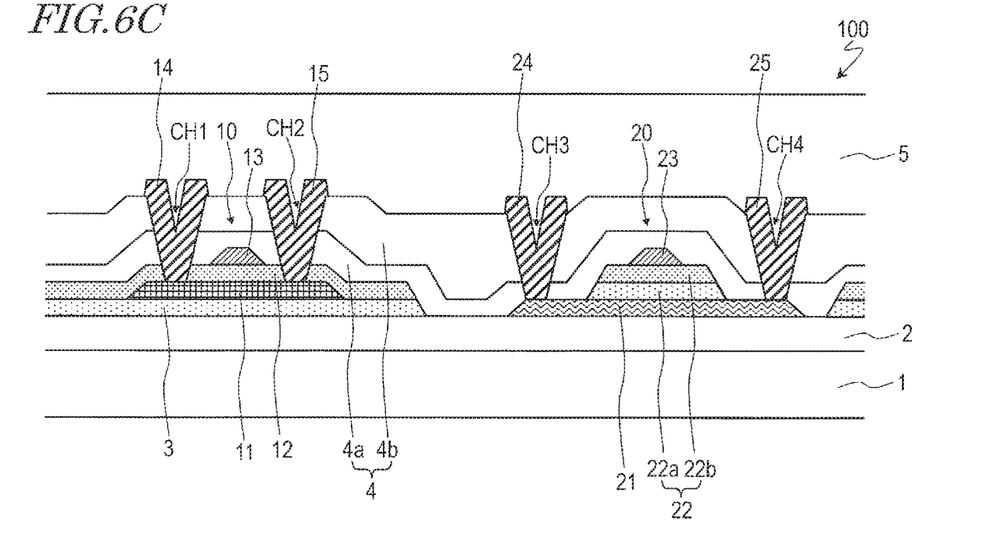

Then, as shown in FIG. 6C, the organic insulating layer 5 is formed that covers the first TFT 10 and the second TFT 20. The organic insulating layer 5 is formed from a photosensitive resin material, for example. The thickness of the organic insulating layer 5 is 1.5 μm or more and 3.0 μm or less, for example.

Thus, the active matrix substrate 100 can be obtained.

Note that a metal layer that overlaps with the crystalline silicon semiconductor layer 11 and a metal layer that overlaps with the oxide semiconductor layer 21 may be provided between the substrate 1 and the base coat layer 2. A metal layer that overlaps with the crystalline silicon semiconductor layer 11 functions as a light-blocking layer. A metal layer that overlaps with the oxide semiconductor layer 21 may function as an additional gate electrode (back gate electrode) by being given a predetermined potential, thereby further improving the current driving capability of the second TFT 20.

Embodiment 2

Figure 7:
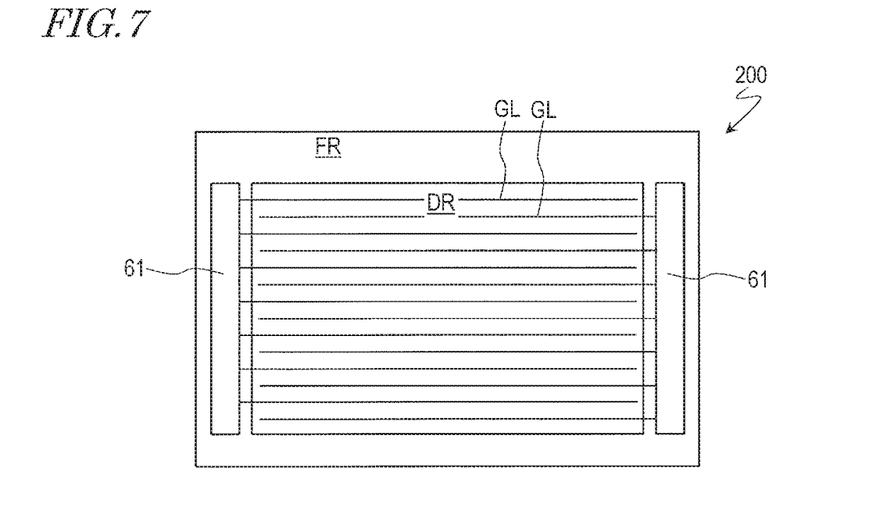
FIG. 7 is a plan view schematically showing an active matrix substrate 200 according to an embodiment of the present invention.
Figure 8:
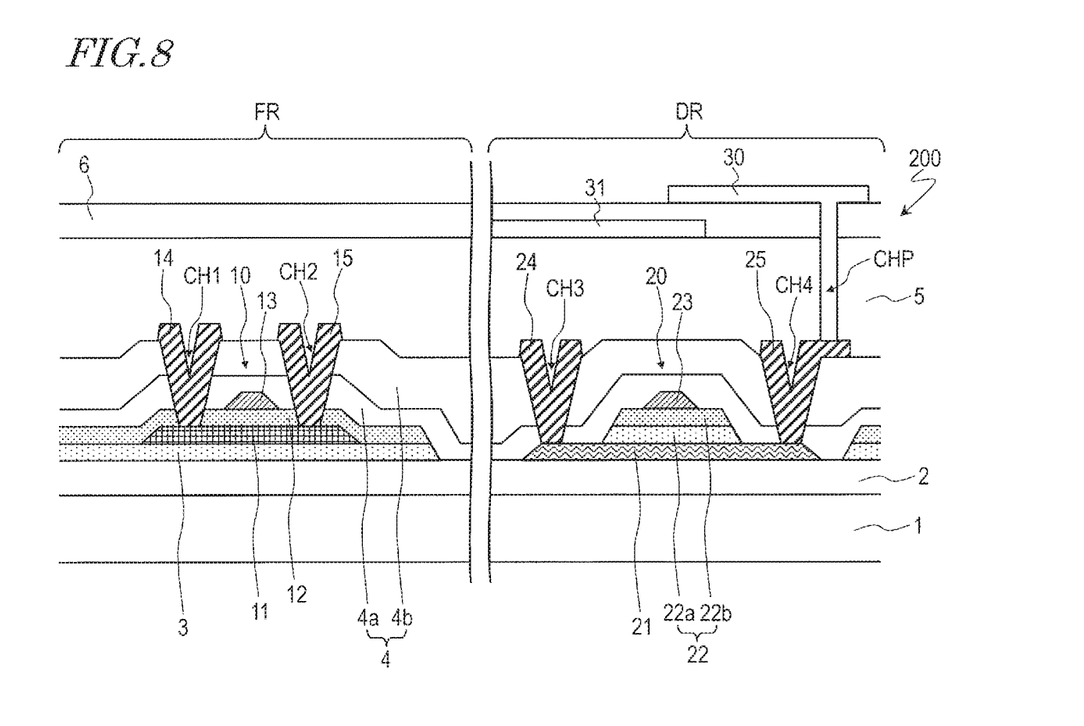
FIG. 8 is a cross-sectional view schematically showing the active matrix substrate 200.

Referring to FIG. 7 and FIG. 8, an active matrix substrate 200 of the present embodiment will be described. FIG. 7 and FIG. 8 are a plan view and a cross-sectional view, respectively, schematically showing the active matrix substrate 200. The description below will focus on differences between the active matrix substrate 200 and the active matrix substrate 100 of Embodiment 1.

The active matrix substrate 200 of the present embodiment is used in a liquid crystal display device of the FFS (Fringe Field Switching) mode. Peripheral circuits are provided in the peripheral region FR of the active matrix substrate 200. FIG. 7 illustrates a gate driver circuit 61 as a peripheral circuit. The gate driver circuit 61 supplies a scanning signal to a plurality of gate bus lines GL.

In the present embodiment, as shown in FIG. 8, the first TFT 10 is arranged in the peripheral region FR, and is a circuit TFT of a peripheral circuit (e.g., the gate driver circuit 61). In contrast, the second TFT 20 is arranged in the display region DR, and is a pixel TFT that is arranged for each of the pixel regions.

In the example shown in FIG. 8, a common electrode 31 is provided on the organic insulating layer 5. The common electrode 31 is provided commonly for a plurality of pixel regions P, thereby giving a common potential across the entire display region DR.

A dielectric layer 6 is provided so as to cover the common electrode 31, and a pixel electrode 30 is provided on the dielectric layer 6. The pixel electrode 30 is connected to the drain electrode 25 of the second TFT 20 through a pixel contact hole CHP running through the dielectric layer 6 and the organic insulating layer 5. Although not shown in the figures, the pixel electrode 30 includes at least one slit.

As described above, with the active matrix substrate 200 of the present embodiment, the first TFT 10, which is a crystalline silicon TFT, is arranged in the peripheral region FR, and the second TFT 20, which is an oxide semiconductor TFT, is arranged in the display region DR. Thus, as the first TFT 10, which is a crystalline silicon TFT having a large current driving capability (a high mobility), is used as a circuit TFT, it is possible to reduce the peripheral region (frame region) FR. As the second TFT 20, which is an oxide semiconductor TFT having a desirable off-leak characteristic, is used as a pixel TFT, it is possible to realize low-frequency driving and to significantly reduce the power consumption.

Embodiment 3

Figure 9:
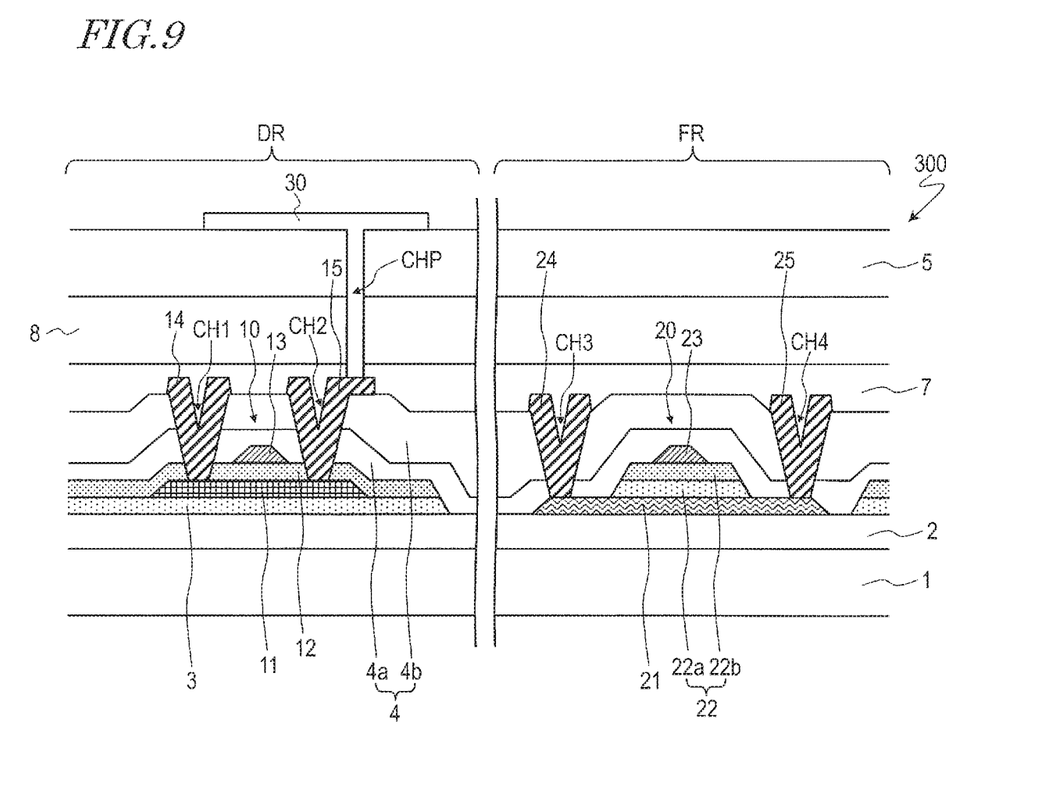
FIG. 9 is a cross-sectional view schematically showing an active matrix substrate 300 according to an embodiment of the present invention.

Referring to FIG. 9, an active matrix substrate 300 of the present embodiment will be described. FIG. 9 is a cross-sectional view schematically showing the active matrix substrate 300.

The active matrix substrate 300 of the present embodiment is used in a bottom emission-type organic EL (electroluminescence) display device.

In the present embodiment, as shown in FIG. 9, the first TFT 10 is a pixel TFT arranged in the display region DR. In contrast, the second TFT 20 is a circuit TFT arranged in the peripheral region FR.

With the active matrix substrate 300, an inorganic insulating layer (protection layer) 7 is provided on the interlayer insulating layer 4 so as to cover the first source electrode 14, etc., and a color filter layer 8 is provided on the inorganic insulating layer 7. Then, the flattening layer 5 is provided on the color filter layer 8, and the pixel electrode 30 is provided on the flattening layer 5. The pixel electrode 30 is connected to the drain electrode 15 of the first TFT 10 through the pixel contact hole CHP running through the flattening layer 5, the color filter layer 8 and the inorganic insulating layer 7.

As described above, with the active matrix substrate 300 of the present embodiment, the first TFT 10, which is a crystalline silicon TFT, is arranged in the display region DR, and the second TFT 20, which is an oxide semiconductor TFT, is arranged in the peripheral region FR. In order to desirably produce multi-gray level display on an organic EL display device, it is preferred that the Vg (gate voltage)-Id (drain current) characteristic of the pixel TFT is somewhat gentle (i.e., not steep), but it may be difficult, with oxide semiconductor TFTs that have currently been in practical use, to realize such a Vg-Id characteristic. By arranging the first TFT 10 in the display region DR and arranging the second TFT 20 in the peripheral region FR as in the present embodiment, it is possible to desirably produce multi-gray level display.

Figure 10:
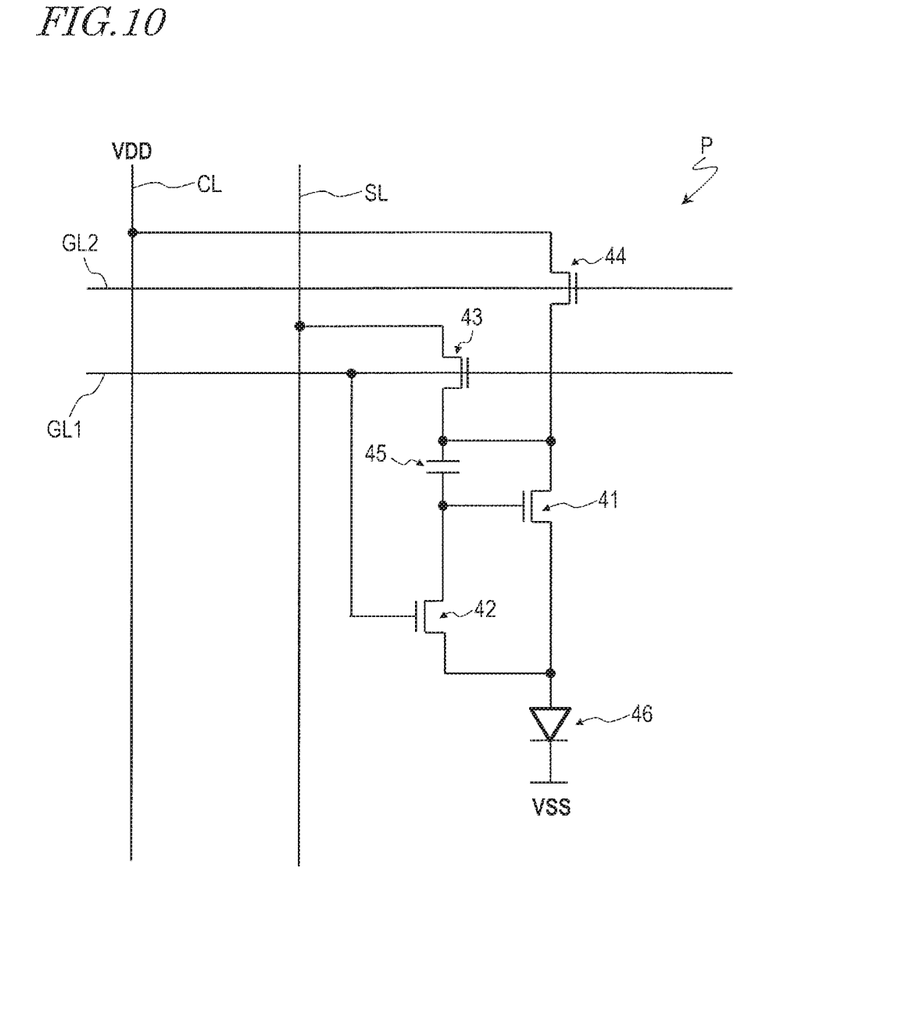
FIG. 10 is a diagram showing an example of an equivalent circuit of one pixel region P of the active matrix substrate 300.

With the active matrix substrate 300 for an organic EL display device, two or more TFTs may be arranged in each pixel region P. FIG. 10 shows an example of an equivalent circuit of one pixel region P of the active matrix substrate 300.

In the example shown in FIG. 10, the pixel region P includes a driver TFT 41, a selection TFT 42, a first current switching TFT 43, a second current switching TFT 44, a capacitor 45 and an OLED (organic light-emitting diode) 46.

The gate electrode of the driver TFT 41 is connected to the source electrode of the selection TFT 42, and one of a pair of electrodes (the first electrode) of the capacitor 45. The source electrode of the driver TFT 41 is connected to the drain electrodes of the first and second current switching TFTs 43 and 44. The drain electrode of the driver TFT 41 is connected to the drain electrode of the selection TFT 42 and the anode electrode of the OLED 46.

The gate electrode of the selection TFT 42 is connected to a first gate bus line GL1. The source electrode of the selection TFT 42 is connected to the gate electrode of the driver TFT 41. The drain electrode of the selection TFT 42 is connected to the drain electrode of the driver TFT 41.

The gate electrode of the first current switching TFT 43 is connected to the first gate bus line GL1. The source electrode of the first current switching TFT 43 is connected to a source bus line SL. The drain electrode of the first current switching TFT 43 is connected to the source electrode of the driver TFT 41 and the other one of the pair of electrodes (second electrode) of the capacitor 45.

The gate electrode of the second current switching TFT 44 is connected to a second gate bus line GL2. The source electrode of the second current switching TFT 44 is connected to the current supply line CL. The current supply line CL is connected to the positive power supply VDD. The drain electrode of the second current switching TFT 44 is connected to the source electrode of the driver TFT 41.

The OLED 46 includes an anode electrode connected to the drain electrode of the driver TFT 41, an organic EL layer formed on the anode electrode, and a cathode electrode formed on the organic EL layer. For example, the organic EL layer has a layered structure of hole transporting layer/organic light-emitting layer/electron transporting layer, or a layered structure of hole injection layer/hole transporting layer/organic light-emitting layer/electron transporting layer/electron injection layer. The organic EL layer may further include a layer for improving the emission efficiency or the lifetime of the organic light-emitting layer. The cathode electrode is connected to the negative power supply VSS.

The pixel circuit shown in FIG. 10 operates as follows.

First, when the selection TFT 42 and the first current switching TFT 43 are selected by the first gate bus line GL1 to achieve an ON state, the driver TFT 41 is brought into a state where the gate electrode thereof and the drain electrode thereof are connected together, i.e., in a diode-connected state. Thus, the capacitor 45 is charged with a voltage that corresponds to the data current $I_{DATA}$ supplied from the source bus line SL.

Next, when the selection TFT 42 and the first current switching TFT 43 are OFF, and the second current switching TFT 44 is selected by the second gate bus line GL2 to achieve an ON state, the current from the current supply line CL is supplied to the OLED 46 via the second current switching TFT 44 and the driver TFT 41 (being ON with the voltage charged in the capacitor 45), thereby lighting the OLED 46.

The driver TFT 41 in the configuration illustrated in FIG. 10 corresponds to the first TFT 10 shown in FIG. 9. That is, the driver TFT 41 is a crystalline silicon TFT. The selection TFT 42, the first current switching TFT 43 and the second current switching TFT 44 may be crystalline silicon TFTs or oxide semiconductor TFTs.

Regarding Oxide Semiconductor

The oxide semiconductor included in the oxide semiconductor layer 21 may be an amorphous oxide semiconductor or a crystalline oxide semiconductor including a crystalline portion. The crystalline oxide semiconductor may be a polycrystalline oxide semiconductor, a microcrystalline oxide semiconductor, a crystalline oxide semiconductor in which the c axis is oriented generally perpendicular to the layer plane, etc.

The oxide semiconductor layer 21 may have a layered structure of two or more layers. When the oxide semiconductor layer 21 has a layered structure, the oxide semiconductor layer 21 may include an amorphous oxide semiconductor layer and a crystalline oxide semiconductor layer, may include a plurality of crystalline oxide semiconductor layers of different crystalline structures, or may include a plurality of amorphous oxide semiconductor layers. When the oxide semiconductor layer 21 has a two-layer structure including an upper layer and a lower layer, the energy gap of the oxide semiconductor included in the upper layer is preferably smaller than the energy gap of the oxide semiconductor included in the lower layer. Note however that when the difference between the energy gaps of these layers is relatively small, the energy gap of the oxide semiconductor of the lower layer may be smaller than the energy gap of the oxide semiconductor of the upper layer.

Materials, structures and deposition methods of the amorphous oxide semiconductor and the crystalline oxide semiconductors described above, and the configuration of the oxide semiconductor layer having a layered structure, etc., are described in Japanese Laid-Open Patent Publication No.

2014-007399, for example. The entire disclosure of Japanese Laid-Open Patent Publication No. 2014-007399 is herein incorporate by reference.

The oxide semiconductor layer 21 may include at least one metal element from among In, Ga and Zn, for example. In an embodiment of the present invention, the oxide semiconductor layer 21 includes an In—Ga—Zn—O-based semiconductor (e.g., indium gallium zinc oxide), for example. Herein, an In—Ga—Zn—O-based semiconductor is a ternary oxide of In (indium), Ga (gallium) and Zn (zinc), and the ratio (composition ratio) between In, Ga and Zn is not limited to any particular ratio and may be In:Ga:Zn=2:2:1, In:Ga:Zn=1:1:1, In:Ga:Zn=1:1:2, or the like, for example. Such an oxide semiconductor layer 21 can be formed from an oxide semiconductor film including an In—Ga—Zn—O-based semiconductor.

An In—Ga—Zn—O-based semiconductor may be amorphous or crystalline. A crystalline In—Ga—Zn—O-based semiconductor is preferably a crystalline In—Ga—Zn—O-based semiconductor whose c axis is oriented generally perpendicular to the layer plane.

Note that The crystalline structure of the crystalline In—Ga—Zn—O-based semiconductor is disclosed in Japanese Laid-Open Patent Publication No. 2014-007399, Japanese Laid-open Patent Publication No. 2012-134475, Japanese Laid-Open Patent Publication No. 2014-209727, etc., for example. The entire contents of Japanese Laid-Open Patent Publication No. 2012-134475 and Japanese Laid-Open Patent Publication No. 2014-209727 are herein incorporate by reference. A TFT including an In—Ga—Zn—O-based semiconductor layer has a high mobility (more than 20 times that of an a-Si TFT) and a low leak current (less than 1/100 that of an a-Si TFT), and is therefore desirably used as a driver TFT (e.g., a TFT included in a driver circuit that is provided around the display region including a plurality of pixels and on the same substrate as the display region) and a pixel TFT (TFT provided in each pixel).

The oxide semiconductor layer 21 may include another oxide semiconductor instead of an In—Ga—Zn—O-based semiconductor. For example, it may include an In—Sn—Zn—O-based semiconductor (e.g., In$_2$O$_3$—SnO$_2$—ZnO; InSnZnO). An In—Sn—Zn—O-based semiconductor is a ternary oxide of In (indium), Sn (tin) and Zn (zinc). Alternatively, the oxide semiconductor layer 21 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, etc.

Display Device

An active matrix substrate according to an embodiment of the present invention can desirably be used in a display device, e.g., an liquid crystal display device and an organic EL display device. A liquid crystal display device includes an active matrix substrate according to an embodiment, of the present invention, a counter substrate arranged so as to oppose the active matrix substrate, and a liquid crystal layer provided between the active matrix substrate and the counter substrate. Note that although an active matrix substrate for a liquid crystal display device of the FFS mode has been described above, an active matrix substrate according to an embodiment of the present invention can be used in liquid crystal display devices of various display modes. An active matrix substrate according to an embodiment of the present invention can also be used in a liquid crystal display device of a transverse electric field mode other than the FFS mode (e.g., the IPS mode), and in a liquid crystal display device of a vertical electric field mode (e.g., the TN mode or the vertical alignment mode). An organic EL display device may include an active matrix substrate according to an embodiment of the present invention, an organic layer provided on the pixel electrode, and a common electrode provided on the organic layer.

According to an embodiment of the present invention, it is possible to realize a suitable structure for an active matrix substrate that includes both oxide semiconductor TFTs and crystalline silicon TFTs. An active matrix substrate according to an embodiment of the present invention can be desirably used in a display device such as a liquid crystal display device or an organic electroluminescent display device.

This application is based on Japanese Patent Applications No. 2017-187574 filed on Sep. 28, 2017, the entire contents of which are hereby incorporated by reference.

What is claimed is:

1. An active matrix substrate including a display region defined by a plurality of pixel regions arranged in a matrix pattern, and a peripheral region located around the display region, the active matrix substrate comprising:
   a substrate;
   a first thin-film transistor (TFT) supported on the substrate and including a crystalline silicon semiconductor layer; and
   a second TFT supported on the substrate and including an oxide semiconductor layer, wherein:
   each of the first TFT and the second TFT has a top gate structure;
   the oxide semiconductor layer is located below the crystalline silicon semiconductor layer,
   the first TFT includes:
      the crystalline silicon semiconductor layer;
      a first gate insulating layer provided on the crystalline silicon semiconductor layer;
      a first gate electrode provided on the first gate insulating layer and opposing the crystalline silicon semiconductor layer with the first gate insulating layer interposed therebetween; and
      a first source electrode and a first drain electrode electrically connected to the crystalline silicon semiconductor layer; and
   the second TFT includes:
      the oxide semiconductor layer;
      a second gate insulating layer provided on the oxide semiconductor layer;
      a second gate electrode provided on the second gate insulating layer and opposing the oxide semiconductor layer with the second gate insulating layer interposed therebetween; and
      a second source electrode and a second drain electrode electrically connected to the oxide semiconductor layer,
   the second gate insulating layer of the second TFT includes a lower gate insulating layer, and an upper gate insulating layer located on the lower gate insulating layer, and
   the first gate insulating layer of the first TFT is in a same layer as the upper gate insulating layer of the second TFT.

2. The active matrix substrate according to claim 1, wherein the crystalline silicon semiconductor layer is provided on an insulating layer that is in a same layer as the lower gate insulating layer of the second TFT.

3. The active matrix substrate according to claim 1, wherein the first gate electrode of the first TFT and the second gate electrode of the second TFT are in a same layer.

4. The active matrix substrate according to claim 1, wherein, wherein:
   the first TFT is arranged in the peripheral region; and
   the second TFT is arranged in the display region.

5. The active matrix substrate according to claim 1, wherein:
   the first TFT is arranged in the display region; and
   the second TFT is arranged in the peripheral region.

6. The active matrix substrate according to claim 1, wherein the oxide semiconductor layer includes an In—Ga—Zn—O-based semiconductor.

7. The active matrix substrate according to claim 6, wherein the In—Ga—Zn—O-based semiconductor includes a crystalline portion.

8. A liquid crystal display device comprising the active matrix substrate according to claim 1.

9. An organic electroluminescent display device comprising the active matrix substrate according to claim 1.

10. The active matrix substrate according to claim 1, further comprising:
    an interlayer insulating layer covering the second gate electrode, the second gate insulating layer, and the oxide semiconductor layer, wherein
    the interlayer insulating layer includes a portion that is in contact with the oxide semiconductor layer.

* * * * *